(12) United States Patent
Van Der Pasch et al.

(10) Patent No.: US 10,289,011 B2
(45) Date of Patent: May 14, 2019

(54) POSITION MEASUREMENT SYSTEM, INTERFEROMETER AND LITHOGRAPHIC APPARATUS

(71) Applicant: ASML NETHERLANDS B.V., Veldhoven (NL)

(72) Inventors: Engelbertus Antonius Fransiscus Van Der Pasch, Oirschot (NL); Robbert Edgar Van Leeuwen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/748,644

(22) PCT Filed: Jul. 29, 2016

(86) PCT No.: PCT/EP2016/068164
§ 371 (c)(1),
(2) Date: Jan. 29, 2018

(87) PCT Pub. No.: WO2017/021299
PCT Pub. Date: Feb. 9, 2017

(65) Prior Publication Data
US 2018/0224757 A1    Aug. 9, 2018

(30) Foreign Application Priority Data
Aug. 4, 2015  (EP) .................................... 15179607

(51) Int. Cl.
*G03F 7/20* (2006.01)
*G01B 9/02* (2006.01)
(Continued)

(52) U.S. Cl.
CPC ..... *G03F 7/70775* (2013.01); *G01B 9/02019* (2013.01); *G01B 9/02061* (2013.01);
(Continued)

(58) Field of Classification Search
CPC ............ G01B 9/02019; G01B 9/02061; G01B 11/026; G01B 11/26; G03F 7/70725; G03F 7/70775; G03F 7/7085
(Continued)

(56) References Cited

U.S. PATENT DOCUMENTS

| 4,859,066 A | 8/1989 | Sommargren |
| 5,151,749 A * | 9/1992 | Tanimoto ............. G01B 11/005 250/548 |

(Continued)

FOREIGN PATENT DOCUMENTS

| JP | 09-210648 | 8/1997 |
| WO | 2008/061186 | 5/2008 |

OTHER PUBLICATIONS

International Search Report and Written Opinion dated Nov. 7, 2016 in corresponding International Patent Application No. PCT/EP2016/068164.

*Primary Examiner* — Colin W Kreutzer
(74) *Attorney, Agent, or Firm* — Pillsbury Winthrop Shaw Pittman LLP (57) ABSTRACT

A position measurement system includes an interferometer to determine a position of an object. The interferometer is arranged to generate a first, second and third signals representative of the position by irradiating respective first, second and third areas of a reflective surface of the object. Along a line, the first and second areas are at a first distance relative to each other, the second and third areas are at a second distance relative to each other, and the first and third areas are at a third distance relative to each other. The interferometer is arranged to provide a rotation signal representative of a rotation of the object along an axis based on the first, second and third signals. The axis is parallel to the reflective surface and perpendicular to the line.

20 Claims, 3 Drawing Sheets

(51) Int. Cl.
*G01B 11/26* (2006.01)
*G01B 11/02* (2006.01)
(52) U.S. Cl.
CPC ............ *G01B 11/026* (2013.01); *G01B 11/26* (2013.01); *G03F 7/7085* (2013.01); *G03F 7/70716* (2013.01); *G03F 7/70725* (2013.01)
(58) Field of Classification Search
USPC ............. 355/68, 72; 356/500, 509, 510, 511
See application file for complete search history.

(56) References Cited

U.S. PATENT DOCUMENTS

| | | |
|---|---|---|
| 5,801,832 A | 9/1998 | Van Den Brink |
| 2003/0020924 A1* | 1/2003 | Inoue .................. G01B 11/002 356/510 |
| 2003/0164948 A1* | 9/2003 | Hill .................... G01B 9/02019 356/487 |
| 2005/0002040 A1 | 1/2005 | Adriaens et al. |
| 2006/0072119 A1 | 4/2006 | Hill et al. |
| 2009/0305176 A1* | 12/2009 | Hattori ................ G03F 7/70508 430/325 |
| 2013/0050675 A1 | 2/2013 | Jansen et al. |

* cited by examiner

POSITION MEASUREMENT SYSTEM, INTERFEROMETER AND LITHOGRAPHIC APPARATUS

CROSS REFERENCE TO RELATED APPLICATIONS

This application is the U.S. national phase entry of PCT patent application no. PCT/EP2016/068164, which was filed on Jul. 29, 2016, which claims the benefit of priority of European Patent application no. 15179607.5, which was filed on Aug. 4, 2015, and which is incorporated herein in its entirety by reference.

FIELD OF THE INVENTION

The invention relates to a position measurement system, an interferometer for use in the position measurement system and a lithographic apparatus comprising the position measurement system.

BACKGROUND ART

A lithographic apparatus is an apparatus that can be used in the manufacture of integrated circuits (ICs). In that instance, a patterning device, which is alternatively referred to as a mask or a reticle, may be used to generate a circuit pattern to be formed on an individual layer of the IC. This pattern can be transferred by a radiation beam via a projection system onto a target portion on a substrate, such as a silicon wafer. Transfer of the pattern is typically via imaging onto a layer of radiation-sensitive material provided on the substrate. In general, a single substrate will contain a network of adjacent target portions that are successively patterned. Known lithographic apparatus include so-called steppers, in which each target portion is irradiated by exposing an entire pattern onto the target portion at one time. Known lithographic apparatus also include so-called scanners, in which each target portion is irradiated by scanning the pattern through a radiation beam in a given direction while synchronously scanning the substrate parallel or anti parallel to this direction.

The cross-section of the radiation beam is typically much smaller than the surface of the substrate. So in order to expose all the target portions on the surface of the substrate, the substrate is moved relative to the projection system. The lithographic apparatus has a stage system to move the substrate relative to the projection system. The stage system is able to move the substrate in such a way that the target portions are placed consecutively in the path of the radiation beam.

To place each of the target portions in the path of the radiation beam correctly, the lithographic apparatus is provided with a position measurement system. The position measurement system measures a position of the stage system. The position measurement system comprises an interferometer and a reflective surface. Typically, the interferometer is stationary and the reflective surface is attached to the stage system. The interferometer is arranged to irradiate the reflective surface. The radiation that the reflective surface reflects back to the interferometer is used by the interferometer to generate a signal representative of a position of the reflective surface. Since the reflective surface is attached to the stage system, the signal is representative of a position of the stage system.

SUMMARY

Due to deformation and misalignment of the reflective surface, the signal may not properly represent the position of the stage system. As a result, when the signal is used to position the substrate relative to the projection system, a position error occurs. The position error may cause that a target portion is not properly irradiated with the pattern.

Whilst great care is taken to ensure that the reflective surface is flat and properly aligned on the stage system, it is usually necessary to measure the shape of the reflective surface and use the resulting mirror map to determine corrections to be applied to the signal. US patent application US2013/0050675A1, published on Feb. 28, 2013, hereby incorporated by reference, discloses calibration methods to measure the reflective surface and to create a mirror map.

However, the known calibration methods are time consuming, since the calibration methods require the interferometer system to perform measurements at different orientations and positions of the stage system. The time needed for the known calibration methods may affect the throughput of the lithographic apparatus significantly. The throughput is especially affected when atmospheric conditions around the stage system often change. For example, when the humidity around the stage system often changes, the glue connecting the reflective surface to the stage system may drift. Glue is often sensitive to changes in humidity. The humidity may change when the atmospheric condition change from atmospheric to vacuum, or may change when dry air is mixed with humid air. Due to changing atmospheric conditions, the reflective surface needs to be calibrated often.

It is an objective of the invention to provide a position measurement system which can be calibrated accurately and swiftly.

According to a first aspect of the invention, there is provided a position measurement system comprising an object having a reflective surface, and an interferometer for determining a position of the object. The reflective surface has a first area, a second area and a third area. The interferometer is arranged to generate a first signal representative of the position by irradiating the first area. The interferometer is arranged to generate a second signal representative of the position by irradiating the second area. The interferometer is arranged to generate a third signal representative of the position by irradiating the third area. Along a line, the first area and the second area are at a first distance relative to each other. Along the line, the second area and the third area are at a second distance relative to each other. Along the line, the first area and the third area are at a third distance relative to each other. The first distance, the second distance and the third distance are different from each other. The interferometer is arranged to provide a rotation signal representative of a rotation of the object along an axis based on the first signal, the second signal and the third signal. The axis is parallel to the reflective surface and perpendicular to the line.

According to a second aspect of the invention, there is provide a lithographic apparatus comprising the position measurement system mentioned above, a patterning device support for holding a patterning device having a pattern, a projection system for projecting the pattern onto a substrate, and a substrate table for holding the substrate. One of the patterning device support and the substrate table comprises the object.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

To explain the embodiments of the invention, use will be made of a Cartesian coordinate system. The coordinate system has an x-axis, a y-axis and a z-axis, each being perpendicular to the others. The coordinate system is for illustrative purposes only and should not be used to limit the scope of the invention.

Figure 1:
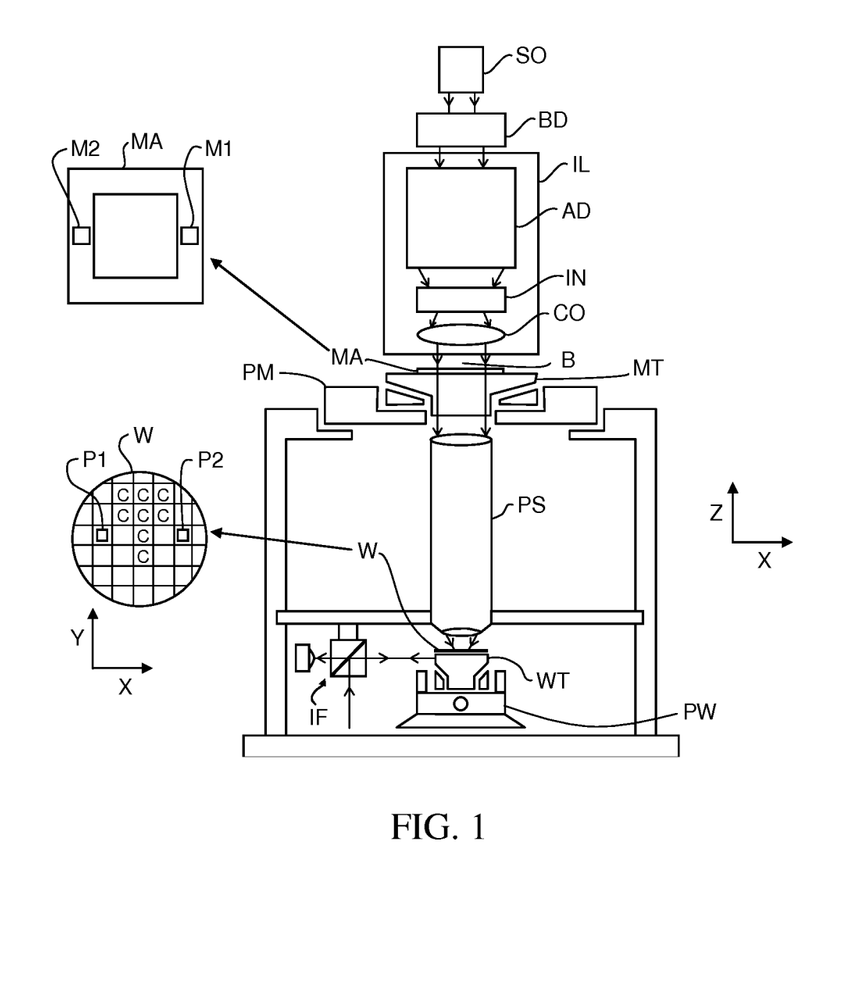
FIG. 1 depicts a lithographic apparatus according to the invention.

FIG. 1 schematically depicts a lithographic apparatus with a position measurement system according to the invention. The lithographic apparatus may comprise an illumination system IL, a patterning device support MT, a substrate table WT and a projection system PS.

The illumination system IL is configured to condition a radiation beam B. The illumination system IL may include various types of optical components, such as refractive, reflective, magnetic, electromagnetic, electrostatic or other types of optical components, or any combination thereof, for directing, shaping, or controlling radiation.

The illumination system IL receives a radiation beam from a radiation source SO. The radiation source SO and the lithographic apparatus may be separate entities, for example when the radiation source SO is an excimer laser. In such cases, the radiation source SO is not considered to form part of the lithographic apparatus and the radiation beam B is passed from the radiation source SO to the illumination system IL with the aid of a beam delivery system BD comprising, for example, suitable directing mirrors and/or a beam expander. In other cases the radiation source SO may be an integral part of the lithographic apparatus, for example when the radiation source SO is a mercury lamp. The radiation source SO and the illumination system IL, together with the beam delivery system BD if required, may be referred to as a radiation system.

The illumination system IL may comprise an adjuster AD for adjusting the angular intensity distribution of the radiation beam. In addition, the illumination system IL may comprise various other components, such as an integrator IN and a condenser CO. The illumination system IL may be used to condition the radiation beam B, to have a desired uniformity and intensity distribution in its cross section.

The term "radiation beam" used herein encompasses all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The patterning device support MT (e.g. a mask table) is for supporting a patterning device MA (e.g. a mask or reticle). The patterning device support MT is connected to a first positioning system PM configured to accurately position the patterning device MA in accordance with certain parameters.

The patterning device support MT supports, i.e. bears the weight of the patterning device MA. The patterning device support MT holds the patterning device MA in a manner that depends on the orientation of the patterning device MA, the design of the lithographic apparatus, and other conditions, such as for example whether or not the patterning device MA is held in a vacuum environment. The patterning device support MT can use mechanical, vacuum, electrostatic or other clamping techniques to hold the patterning device MA. The patterning device support MT may be a frame or a table, for example, which may be fixed or movable as required. The patterning device support MT may ensure that the patterning device MA is at a desired position, for example with respect to the projection system PS.

The term "patterning device" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam B will correspond to a particular functional layer in a device being created in the target portion C, such as an integrated circuit.

The patterning device MA may be transmissive or reflective. Examples of a patterning device MA include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix. As here depicted, the lithographic apparatus is of a transmissive type, which employs a transmissive mask.

The substrate table WT, e.g. a wafer table, is for holding a substrate W, e.g. a resist coated wafer. The substrate table WT is connected to a second positioning system PW configured to accurately position the substrate W in accordance with certain parameters.

The projection system PS is configured to project a pattern imparted to the radiation beam B by patterning device MA onto a target portion C of the substrate W.

The term "projection system" used herein should be broadly interpreted as encompassing any type of projection system PS, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

The radiation beam B is incident on the patterning device MA, which is held on the patterning device support MT, and is patterned by the patterning device MA. Having traversed the patterning device MA, the radiation beam B passes through the projection system PS which focuses the radiation beam B onto a target portion C of the substrate W. With the aid of the second positioning system PW and position sensor IF (e.g. an interferometric device, linear encoder or capacitive sensor), the substrate table WT can be moved accurately, e.g. so as to position different target portions C in the path of the radiation beam B. Similarly, the first positioning system PM and another position sensor (which is not depicted in FIG. 1) can be used to accurately position the patterning device MA with respect to the path of the radiation beam B. In general, movement of the patterning device support MT may be realized with the aid of a long-stroke module and a short-stroke module. The long-stroke module provides coarse positioning of the short-stroke module relative to the projection system PS over a long range. The short-stroke module provides fine positioning of the patterning device MA relative to the long-stroke module over a small range. Similarly, movement of the substrate table WT may be realized using a long-stroke module and a short-stroke module, which form part of the second positioning system PW. In the case of a stepper (as opposed to a scanner) the patterning device support MT may be connected to a short-stroke actuator only, or may be fixed. The first positioning system PM and the second positioning system PW may each be considered as a part of a stage system.

Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. Similarly, in situations in which more than one die is provided on the patterning device MA, the mask alignment marks M1, M2 may be located between the dies.

The lithographic apparatus may be of a type having two or more substrate tables WT and/or two or more patterning device supports MT. In addition to the at least one substrate table WT, the lithographic apparatus may comprise a measurement table, which is arranged to perform measurements but is not arranged to hold a substrate. The measurement table may, for example, be arranged to measure a property of the radiation beam B.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

The depicted lithographic apparatus could be used in at least one of the following three modes:

In the first mode, the so-called step mode, the patterning device support MT and the substrate table WT are kept essentially stationary, while an entire pattern imparted to the radiation beam is projected onto a target portion C at one time. The substrate table WT is then shifted in the X and/or Y direction by the second positioning system PW, so that a different target portion C can be exposed.

In the second mode, the so-called scan mode, the patterning device MT and the substrate table WT are scanned synchronously while a pattern imparted to the radiation beam is projected onto a target portion C. The velocity and direction of the substrate table WT relative to the patterning device MT may be determined by the (de-)magnification and image reversal characteristics of the projection system PS.

In the third mode, the patterning device support MT is kept essentially stationary holding a programmable patterning device MA, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device MA, such as a programmable mirror array of a type as referred to above.

Combinations and/or variations on the above described modes of use or entirely different modes of use may also be employed.

Figure 2:
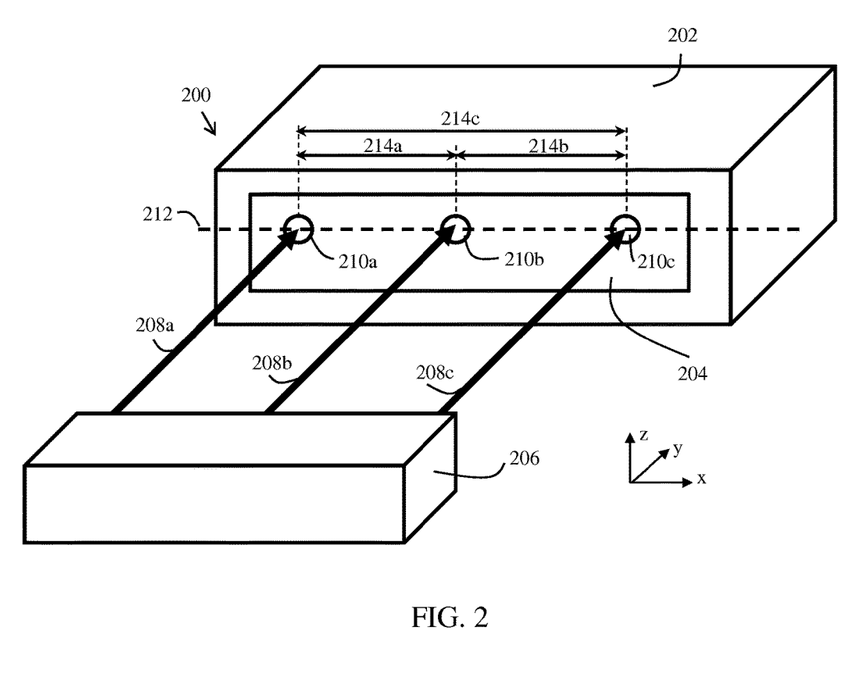
FIG. 2 depicts a position measurement system according to an embodiment of the invention.

FIG. 2 a position measurement system 200 according to an embodiment of the invention. The position measurement system 200 comprises an object 202 having a reflective surface 204, and comprises an interferometer 206 for determining a position of the object 202. The reflective surface 204 has a first area 210a, a second area 210b and a third area 210c. The interferometer 206 is arranged to generate a first signal representative of the position of the object 202 by irradiating the first area 210a. The interferometer 206 is arranged to generate a second signal representative of the position of the object 202 by irradiating the second area 210b. The interferometer 206 is arranged to generate a third signal representative of the position of the object 202 by irradiating the third area 210c. Along a line 212, the first area 210a and the second area 210b are at a first distance 214a relative to each other. Along the line 212, the second area 210b and the third area 210c are at a second distance 214b relative to each other. Along the line 212, the first area 210a and the third area 210c are at a third distance 214c relative to each other. The first distance 214a, the second distance 214b and the third distance 214c are different from each other.

The first area 210a is the area of the reflective surface 204 on which the measurement beam 208a is incident. The second area 210b is the area of the reflective surface 204 on which the measurement beam 208b is incident. The third area 210c is the area of the reflective surface 204 on which the measurement beam 208c is incident.

The position measurement system 200 may comprise the position sensor IF. The object 202 may be comprised by the patterning device support MT, the substrate table WT, the first positioning system PM or the second positioning system PW.

Line 212 is illustrated as a line parallel to the x-axis and in the plane of the reflective surface 204. Alternative, line 212 may have a different direction than parallel to the x-axis, for example parallel to the z-axis or in any other direction in the xz-plane. The direction of line 212 may be determined by the location of the first area 210a and the second area 210b on the reflective surface 204. Alternatively, the direction of line 212 may be determined by the location of the third area 210c and one of the first area 210a and the second area 210b on the reflective surface 204. The first distance 214a, the second distance 214b and the third distance 214c may be determined along the direction of the line 212.

The interferometer 206 generates the first signal by irradiating the first area 210a with a measurement beam 208a. The measurement beam 208a is reflected back to the interferometer 206 by the first area 210a. The interferometer 206 combines and interferes the measurement beam 208a reflected from the first area 210a and a reference beam. Based on the interference of the measurement beam 208a reflected from the first area 210a and a reference beam, the interferometer 206 is able to provide the first signal. The first signal may represent a distance in the y-direction between the object 202 and the interferometer 206.

The interferometer 206 generates the second signal by irradiating the second area 210b with a measurement beam 208b. The measurement beam 208b is reflected back to the interferometer 206 by the second area 210b. The interferometer 206 combines and interferes the measurement beam 208b reflected from the second area 210b and a reference beam. Based on the interference of the measurement beam 208b reflected from the first area 210a and a reference beam, the interferometer 206 is able to provide the second signal. The second signal may represent a distance in the y-direction between the object 202 and the interferometer 206.

The interferometer 206 generates the third signal by irradiating the third area 210c with a measurement beam 208c. The measurement beam 208c is reflected back to the interferometer 206 by the third area 210c. The interferometer 206 combines and interferes the measurement beam 208c reflected from the third area 210c and a reference beam. Based on the interference of the measurement beam 208c reflected from the third area 210c and a reference beam, the interferometer 206 is able to provide the third signal. The third signal may represent a distance in the y-direction between the object 202 and the interferometer 206.

When the first signal, the second signal and the third signal each represent a position of the object 202, for example a y-position, the first signal, the second signal and the third signal together form redundant position information. Based on the redundant information, a shape of the reflective surface 204 may be determined.

In reality, the reflective surface 204 may be larger in the x-direction than indicated in FIG. 2, so that after a movement of the object 202, the first area 210a is at a location on the reflective surface 204 where the second area 210b was before the movement. Similarly, after a movement of the object 202, the second area 210b is at a location on the reflective surface 204 where the third area 210c was before the movement. In an embodiment, the third distance 214c is much smaller than the length of the reflective surface 204 in the x-direction.

Since the first distance 214a is different from the second distance 214b, it is possible to observe via the first signal, the second signal and the third signal, spatial frequencies in the shape of the reflective surface 204 that would not be observable if the first distance 214a would be the same as the second distance 214b. In an embodiment, the first distance 214a is unequal to an integer times the second distance 214b or vice versa. In that embodiment, the difference between the first distance 214a and the second distance 214b is such that a higher order of a spatial frequency that fits in the first distance 214a does not fit in the second distance 214b. For example, the first distance 214a and the second distance 214b may be respectively 4 and 5 mm or 9 and 10 mm or 13 and 15 mm or 25 and 26 mm. The difference between the first distance 214a and the second distance 214b may be 0.5 mm or 1 mm or 2 mm.

In an embodiment, the position measurement system 200 is arranged to provide a rotation signal representative of a rotation of the object 202 along an axis based on the first signal, the second signal and the third signal, wherein the axis is parallel to the reflective surface 204 and perpendicular to the line 212. For example, the position measurement system 200 is arranged to provide the rotation signal to represent a rotation of the object 202 along the z-axis. Depending on the center of the rotation, the rotation will cause the y-positions of the first area 210a, the second area 210b and the third area 210c to displace differently from each other. For example, if the center of the rotation along the z-axis is at the second area 210b, the first area 210a may move in the positive y direction, the third area 210c may move in the negative y-direction, and the second area 210b may remain substantially at the same y-position.

Because the first distance 214a is different from the second distance 214b, the rotation signal is an absolute signal, i.e., has an unique value, over a larger range than each of the first signal, the second signal and the third signal. Even when the first signal, the second signal and the third signal are incremental signals, the combination of the first signal, the second signal and the third signal may be unique for a large range of the rotation around the z-axis, because the first distance 214a is different from the second distance 214b. The range may be made large by selecting a small difference between the first distance 214a and the second distance 214b, for example, the first distance 214a is 70%, 80%, 90% or 95% of the second distance 214b.

Figure 3:
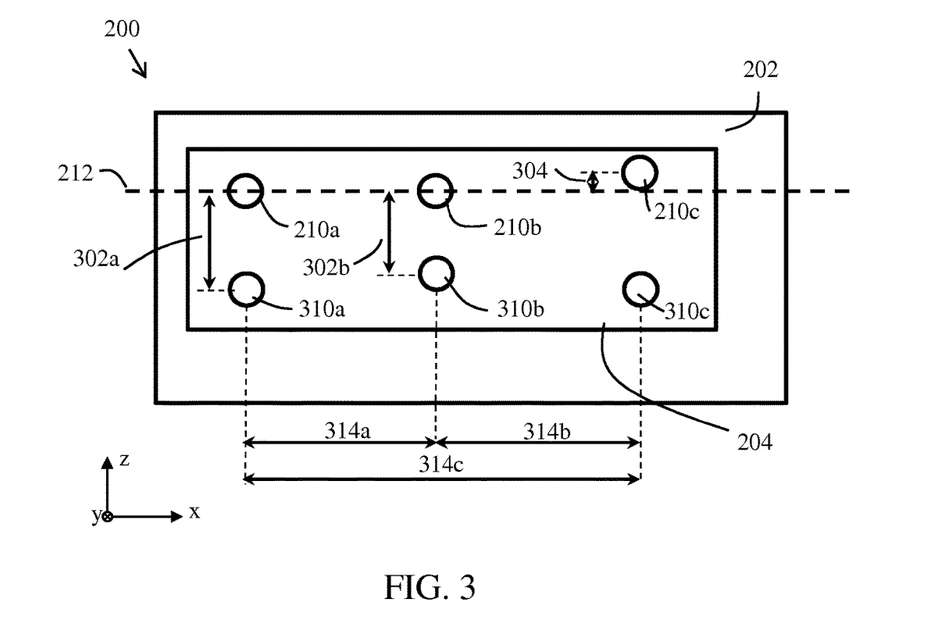
FIG. 3 depicts a position measurement system according to a further embodiment of the invention.

FIG. 3 depicts the position measurement system 200 according to a further embodiment of the invention. FIG. 3 depicts some of the same references as the embodiment depicted in FIG. 2. In addition, FIG. 3 shows on the reflective surface 204 a fourth area 310a and a fifth area 310b. The fourth area 310a is at a first offset 302a relative to the line 212. The fifth area 310b is at a second offset 302b relative to the line 212. The interferometer 206 is arranged to generate a fourth signal representative of the position of the object 202 by irradiating the fourth area 310a. The interferometer 206 is arranged to generate a fifth signal representative of the position of the object 202 by irradiating the fifth area 310b. The first offset 302a is different from the second offset 302b.

The object 202 may be rotatable around a further axis, e.g., the x-axis. The position measurement system 200 may be arranged to determine the rotation of the object 202 around the x-axis based on at least one of the first signal, the second signal and the third signal, and on at least one of the fourth signal and the fifth signal. For example, the position measurement system 200 is arranged to determine the rotation around the x-axis on a first y-position indicated with the first signal, a second y-position indicated by the fourth signal and a distance between the first area 210a and the fourth area 310a along the z-axis. In an embodiment, the x-axis is parallel to the line 212. The term "rotatable" may have the same meaning as the term "tiltable".

The position measurement system 200 may comprise a rotational zeroing system arranged to provide a rotational initialization signal based on a rotation of the object 202. The rotational zeroing system may be any type of sensor that is able to determine a rotational position of the object 202. The interferometer 206 may be an incremental interferometer with a certain measurement period. The interferometer 206 may accurately determine an absolute position within the measurement period, but may not determine, by itself, in which measurement period. Therefore, the interferometer 206 may need the rotational initialization signal to determine an absolute position of the object 202. The rotational zeroing system may be less accurate than the interferometer 206. However, the rotational zeroing system needs to be accurate enough so the interferometer 206 may determine the correct measurement period. The accuracy of the rotational zeroing system needed is referred to as phase capture range.

Because the first offset 302a is different from the second offset 302b, the phase capture range can be increased significantly, allowing the use of a less accurate rotational zeroing system and reducing the chance that the rotational zeroing system is not able provide a correct initialization signal.

In the following example, the rotation of the object 202 along the x-axis is determined by using the first signal, the fourth signal and the fifth signal. Alternatively, other signals could be used. Because the first offset 302a is different from the second offset 302b, the combination of the first signal, the fourth signal and the fifth signal repeats itself after a much larger rotation along the x-axis then would be the case if the first offset 302a were the same as the second offset 302b. The inventors have discovered that the phase capture range increases by a factor which can be calculated by dividing the first offset 302a by the difference between the first offset 302a and the second offset 302b. So a small difference would result in a large increase of the phase capture range.

In FIG. 3, the first offset 302a and the second offset 302b each are below the line 212. In an embodiment, one of the first offset 302a and the second offset 302b is below the line 212 and the other one of the first offset 302a and the second offset 302b is in the opposite direction, i.e., above the line 212. One of the first area 210a, the second area 210b and the third area 210c may have an offset relative to the line 212. In FIG. 3, the third area 210c has a third offset 304 relative to the line 212. The third offset 304 may be used instead of or in combination with one of the first offset 302a and the second offset 302b to increase the phase capture. The first offset 302a, the second offset 302b and the third offset 304 may all be used to increase the phase capture In FIG. 3, the reflective surface 204 has a sixth area 310c. The interferometer 206 is arranged to generate a sixth signal representative of the position of the object 202 by irradiating the sixth area 310c. The sixth area 310c is at an offset relative to the line 212. Along the line 212, the fourth area 310a and the fifth area 310b are at a fourth distance 314a relative to each other. Along the line 212, the fifth area 310b and the sixth area 310c are at a fifth distance 314b relative to each other. Along the line 212, the fourth area 310a and the sixth area 310c are at a sixth distance 314c relative to each other. The fourth distance 314a, the fifth distance 314b and the sixth distance 314c are different from each other. Similar to what is described above, the fourth signal, the fifth signal and the sixth signal can be used to determine a shape of the reflective surface 204. When the reflective surface 204 is formed by a single mirror, the first signal, the second signal, the third signal, the fourth signal, the fifth signal and the sixth signal can be used to rapidly determine the shape of the reflective surface 204.

In an embodiment, the reflective surface is formed by a first reflective surface and a second reflective surface. The first area, the second area and the third area are on the first reflective surface. The fourth area and the fifth area are on the second reflective surface. The first signal, the second signal, the third signal can be used to determine the shape of the first reflective surface. The fourth signal and the fifth signal can be used to determine the shape of the second reflective surface. Additionally, the sixth signal may be used to determine the shape of the second reflective surface. The first reflective surface and the second reflective surface may be separated from each other. The first reflective surface may be formed by a first mirror, and the second reflective surface may be formed by a second mirror.

Although FIG. 2 indicated that only a single measurement beam 208a is irradiating the first area 210a, the interferometer 206 may comprise a double-pass interferometer. A double-pass interferometer may provide the measurement beam 208a and irradiate the first area 210a. When the measurement beam 208a reflects back to the interferometer 206 from the first area 210a, the interferometer 206 may reflect the measurement beam 208a back to the first area 210a. In that case, the measurement beam 208a comprises two measurement beams. A double-pass interferometer has the advantage that the first signal can still be generated even when the object 202 is rotated. The interferometer 206 may be a double-pass interferometer for one or more of the measurement beams 208a, 208b and 208c.

The interferometer may comprise an optical component arranged to propagate the first measurement beam 208a, the second measurement beam 208b and the third measurement beam 208c. The optical component may be a single component. Alternatively, the optical component may be divided in two or more parts. A part may only propagate only one of the first measurement beam 208a, the second measurement beam 208b and the third measurement beam 208c.

In an embodiment, the position measurement system 200 is provided with a position zeroing system arranged to provide a position initialization signal based on the position of the object 202. The position measurement system 200 may be arranged to determine an absolute position of the object 202 based on the first signal, the second signal and the third signal, and on the position initialization signal.

The interferometer 206 may need the position initialization signal to determine an absolute position of the object 202 in case the interferometer 206 comprises an incremental interferometer with a certain measurement period. The position zeroing system may be less accurate than the interferometer 206. However, the position zeroing system needs to be accurate enough so the interferometer 206 may determine the correct measurement period. The accuracy of the position zeroing system needed is also referred to as phase capture range.

Because the first distance 214a is different from the second distance 214b, the phase capture range can be increased significantly, allowing the use of a less accurate position zeroing system and reducing the chance that the position zeroing system is not able provide a correct position initialization signal. Because the first distance 214a is different from the second distance 214b, the combination of the first signal, the second signal and the third signal repeats itself after a much larger translation along the x-axis then would be the case if the first distance 214a were the same as the second distance 214b. The inventors have discovered that the phase capture range increases by a factor which can be calculated by dividing the first distance 214a by the difference between the first distance 214a and the second distance 214b. So a small difference would result in a large increase of the phase capture range.

The position measurement system 200 may be used in the lithographic apparatus for determine the position of at least one of the patterning device support MT and the substrate table WT.

The lithographic apparatus may be provided with a further position measurement system. The position measurement system 200 may be arranged to determine the position of the object 202 along a first axis, for example the y-axis. The further measurement system may be arranged to determine the position of the object 202 along a second axis different from the first axis, for example the x-axis.

The position measurement system 200 may be used in combination with an encoder system arranged to provide an encoder signal representative of a position of the object 202. The encoder signal may be representative of the same position of the object 202, for example the y-position, as the signal provided by the position measurement system 200. Alternative, the encoder signal may be representative of a position of the object 202 in a different axis than the signal of the position measurement system 200. The position measurement system 200 may be used to calibrate the encoder system.

The position of the object 202 mentioned above may be a position along one or more of the x-axis, the y-axis and the z-axis. The position of the object 202 may be a rotation around one or more of the x-axis, y-axis and the z-axis.

Although the reflective surface 204 is illustrated as a surface parallel to the xz-plane, the reflective surface 204 may be orientated differently. The reflective surface 204 may be perpendicular to the direction of the measurement beam 208a or may be at another angle relative to the measurement beam 208a. The angle may be 30 degrees or 45 degrees or 60 degrees, or any other angle suitable for the interferometer 206 to provide the first signal, the second signal and the third signal. An additional reflective surface may be used to direct the measurement beams 208a, 208b, 208c. The additional reflective surface may be stationary or may be connected to the object 202 or may be connected to the interferometer.

In an embodiment, there is provided a position measurement system, comprising: an object having a reflective surface, and an interferometer for determining a position of the object, wherein the reflective surface has a first area, a second area and a third area, wherein the interferometer is arranged to generate a first signal representative of the position by irradiating the first area, wherein the interferometer is arranged to generate a second signal representative of the position by irradiating the second area, wherein the interferometer is arranged to generate a third signal representative of the position by irradiating the third area, wherein, along a line, the first area and the second area are at a first distance relative to each other, wherein, along the line, the second area and the third area are at a second distance relative to each other, wherein, along the line, the first area and the third area are at a third distance relative to each other, wherein the first distance, the second distance and the third distance are different from each other, wherein the interferometer is arranged to provide a rotation signal representative of a rotation of the object along an axis based on the first signal, the second signal and the third signal, and wherein the axis is parallel to the reflective surface and perpendicular to the line.

In an embodiment, the position measurement system is further arranged to determine a shape of the reflective surface based on the first signal, the second signal and the third signal. In an embodiment, the reflective surface has a fourth area and a fifth area, wherein the fourth area is at a first offset relative to the line, wherein the fifth area is at a second offset relative to the line, wherein the interferometer is arranged to generate a fourth signal representative of the position by irradiating the fourth area, wherein the interferometer is arranged to generate a fifth signal representative of the position by irradiating the fifth area, and wherein the first offset is different in length than the second offset. In an embodiment, the first offset is in an opposite direction of the second offset. In an embodiment, the object is rotatable around a further axis, wherein the position measurement system is arranged to determine a further rotation of the object around the further axis based on at least one of the first signal, the second signal and the third signal and based on at least one of the fourth signal and the fifth signal. In an embodiment, the further axis is parallel to the line. In an embodiment, the object comprises a first reflective surface and a second reflective surface separate from the first reflective surface, wherein the reflective surface is formed by the first reflective surface and the second reflective surface, wherein the first area, the second area and the third area are on the first reflective surface, and wherein the fourth area and the fifth area are on the second reflective surface. In an embodiment, the reflective surface has a sixth area, wherein the interferometer is arranged to generate a sixth signal representative of the position by irradiating the sixth area, wherein the sixth area is at a third offset relative to the line, wherein, along the line, the fourth area and the fifth area are at a fourth distance relative to each other, wherein, along the line, the fifth area and the sixth area are at a fifth distance relative to each other, wherein, along the line, the fourth area and the sixth area are at a sixth distance relative to each other, and wherein the fourth distance, the fifth distance and the sixth distance are different from each other. In an embodiment, the position measurement system comprises a rotational zeroing system arranged to provide a rotational initialization signal based on the rotation of the object, wherein the position measurement system is arranged to determine an absolute rotation of the object based on the rotation signal and on the rotational initialization signal. In an embodiment, the position measurement system comprises a position zeroing system arranged to provide a position initialization signal based on the position of the object, wherein the position measurement system is arranged to determine an absolute position of the object based on the first signal, the second signal and the third signal and the position initialization signal. In an embodiment, the interferometer comprises a double pass interferometer. In an embodiment, the interferometer comprises an optical component arranged to propagate a first measurement beam, a second measurement beam and a third measurement beam, wherein the first measurement beam is arranged to irradiate the first area, wherein the second measurement beam is arranged to irradiate the second area, and wherein the third measurement beam is arranged to irradiate the third area.

In an embodiment, there is provided an interferometer for use in the position measurement system as described herein.

In an embodiment, there is provided a lithographic apparatus comprising a position measurement system as described herein, a patterning device support for holding a patterning device having a pattern, a projection system for projecting the pattern onto a substrate, and a substrate table for holding the substrate, wherein one of the patterning device support and the substrate table comprises the object. In an embodiment, the lithographic apparatus comprising a further measurement system, wherein the position measurement system is arranged to determine the position of the object along a first axis, and wherein the further measurement system is arranged to determine the position of the object along a second axis different from the first axis. In an embodiment, the lithographic apparatus comprises an encoder system arranged to provide an encoder signal representative of the position of the object.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate W and develops the exposed resist), a metrology tool and/or an inspection tool. Further, the substrate W may be processed more than once, for example in order to create a multi-layer IC, so that the term substrate W used herein may also refer to a substrate W that already contains multiple processed layers.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A position measurement system, comprising:
an object having a reflective surface, and
an interferometer configured to determine a position of the object,
wherein the reflective surface has a first area, a second area and a third area,
wherein the interferometer is arranged to generate a first signal representative of the position by irradiating the first area,
wherein the interferometer is arranged to generate a second signal representative of the position by irradiating the second area,
wherein the interferometer is arranged to generate a third signal representative of the position by irradiating the third area,
wherein, along a line, the first area and the second area are at a first distance relative to each other,
wherein, along the line, the second area and the third area are at a second distance relative to each other,
wherein, along the line, the first area and the third area are at a third distance relative to each other,
wherein the first distance, the second distance and the third distance are different from each other,
wherein the interferometer is arranged to provide a rotation signal representative of a rotation of the object along an axis based on the first signal, the second signal and the third signal, the axis being parallel to the reflective surface and perpendicular to the line,
wherein the reflective surface has a fourth area and a fifth area,
wherein the fourth area is at a first offset relative to the line,
wherein the fifth area is at a second offset relative to the line,
wherein the interferometer is arranged to generate a fourth signal representative of the position by irradiating the fourth area,
wherein the interferometer is arranged to generate a fifth signal representative of the position by irradiating the fifth area, and
wherein the first offset is different in length than the second offset.

2. The position measurement system according to claim 1, further arranged to determine a shape of the reflective surface based on the first signal, the second signal and the third signal.

3. The position measurement system according to claim 1, wherein the first offset is in an opposite direction of the second offset.

4. The position measurement system according to claim 1, wherein the object is rotatable around a further axis, and
wherein the position measurement system is arranged to determine a further rotation of the object around the further axis based on one or more selected from: the first signal, the second signal and/or the third signal, and based on the fourth signal and/or the fifth signal.

5. The position measurement system according to claim 4, wherein the further axis is parallel to the line.

6. The position measurement system according to claim 1, wherein the object comprises a first reflective surface and a second reflective surface separate from the first reflective surface,
wherein the reflective surface is formed by the first reflective surface and the second reflective surface,
wherein the first area, the second area and the third area are on the first reflective surface, and
wherein the fourth area and the fifth area are on the second reflective surface.

7. The position measurement system according to claim 1,
wherein the reflective surface has a sixth area,
wherein the interferometer is arranged to generate a sixth signal representative of the position by irradiating the sixth area,
wherein the sixth area is at a third offset relative to the line,
wherein, along the line, the fourth area and the fifth area are at a fourth distance relative to each other,
wherein, along the line, the fifth area and the sixth area are at a fifth distance relative to each other,
wherein, along the line, the fourth area and the sixth area are at a sixth distance relative to each other, and
wherein the fourth distance, the fifth distance and the sixth distance are different from each other.

8. The position measurement system according to claim 1, comprising a rotational zeroing system arranged to provide a rotational initialization signal based on the rotation of the object, wherein the position measurement system is arranged to determine an absolute rotation of the object based on the rotation signal and on the rotational initialization signal.

9. The position measurement system according to claim 1, comprising a position zeroing system arranged to provide a position initialization signal based on the position of the object, wherein the position measurement system is arranged to determine an absolute position of the object based on the first signal, the second signal and the third signal and the position initialization signal.

10. The position measurement system according to claim 1, wherein the interferometer comprises a double pass interferometer.

11. The position measurement system according to claim 1, wherein the interferometer comprises an optical component arranged to propagate a first measurement beam, a second measurement beam and a third measurement beam,
wherein the first measurement beam is arranged to irradiate the first area,
wherein the second measurement beam is arranged to irradiate the second area, and
wherein the third measurement beam is arranged to irradiate the third area.

12. An interferometer for use in a position measurement system, the interferometer comprising:
a radiation output configured to direct radiation toward an object having a reflective surface; and
a detector configured to measure radiation redirected by the reflective surface,
wherein the interferometer is arranged to generate a first signal representative of the position by irradiating a first area of the reflective surface,
wherein the interferometer is arranged to generate a second signal representative of the position by irradiating a second area of the reflective surface,
wherein the interferometer is arranged to generate a third signal representative of the position by irradiating a third area of the reflective surface, wherein, along a line, the first area and the second area are at a first distance relative to each other, wherein, along the line, the second area and the third area are at a second distance relative to each other, wherein, along the line, the first area and the third area are at a third distance relative to each other, wherein the first distance, the second distance and the third distance are different from each other, wherein the interferometer is arranged to provide a rotation signal representative of a rotation of the object along an axis based on the first signal, the second signal and the third signal, the axis being parallel to the reflective surface and perpendicular to the line, wherein the interferometer is arranged to generate a fourth signal representative of the position by irradiating a fourth area of the reflective surface, the fourth area is at a first offset relative to the line, wherein the interferometer is arranged to generate a fifth signal representative of the position by irradiating a fifth area of the reflective surface, the fifth area is at a second offset relative to the line, and wherein the first offset is different in length than the second offset.

13. A lithographic apparatus comprising:
the position measurement system according to claim 1,
a patterning device support configured to hold a patterning device having a pattern,
a projection system configured to project the pattern onto a substrate, and
a substrate table configured to hold the substrate,
wherein either the patterning device support or the substrate table comprises the object.

14. The lithographic apparatus according to claim 13, comprising a further measurement system,
wherein the position measurement system is arranged to determine the position of the object along a first axis, and
wherein the further measurement system is arranged to determine the position of the object along a second axis different from the first axis.

15. The lithographic apparatus according to claim 13, comprising an encoder system arranged to provide an encoder signal representative of the position of the object.

16. The interferometer according to claim 12, wherein the first offset is in an opposite direction of the second offset.

17. The interferometer according to claim 12, wherein the object is rotatable around a further axis, and
wherein the interferometer is arranged to determine a further rotation of the object around the further axis based on one or more selected from: the first signal, the second signal and/or the third signal, and based on the fourth signal and/or the fifth signal.

18. The interferometer according to claim 17, wherein the further axis is parallel to the line.

19. The interferometer according to claim 12, comprising a rotational zeroing system arranged to provide a rotational initialization signal based on the rotation of the object, wherein the interferometer is arranged to determine an absolute rotation of the object based on the rotation signal and on the rotational initialization signal.

20. The interferometer according to claim 12, wherein the interferometer comprises a double pass interferometer.

* * * * *